(12) United States Patent
Tain et al.

(10) Patent No.: US 11,127,664 B2
(45) Date of Patent: Sep. 21, 2021

(54) CIRCUIT BOARD AND MANUFACTURING METHOD THEREOF

(71) Applicant: Unimicron Technology Corp., Taoyuan (TW)

(72) Inventors: Ra-Min Tain, Taoyuan (TW); Kai-Ming Yang, Taoyuan (TW); Wang-Hsiang Tsai, Taoyuan (TW); Tzyy-Jang Tseng, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 455 days.

(21) Appl. No.: 15/391,861

(22) Filed: Dec. 28, 2016

(65) Prior Publication Data
US 2017/0110393 A1 Apr. 20, 2017

Related U.S. Application Data

(60) Continuation-in-part of application No. 14/602,656, filed on Jan. 22, 2015, now Pat. No. 9,781,843, which
(Continued)

(30) Foreign Application Priority Data

Oct. 31, 2011 (TW) .................................. 100139667
Oct. 20, 2016 (TW) .................................. 105133848

(51) Int. Cl.
*H05K 1/02* (2006.01)
*H05K 1/03* (2006.01)
(Continued)

(52) U.S. Cl.
CPC ...... *H01L 23/49827* (2013.01); *H01L 21/486* (2013.01); *H01L 21/4846* (2013.01);
(Continued)

(58) Field of Classification Search
CPC ............. H01L 23/49827; H01L 23/147; H01L 21/4846; H01L 23/49822; H01L 23/49894;
(Continued)

(56) References Cited

U.S. PATENT DOCUMENTS 6,908,856 B2 6/2005 Beyne et al.
7,186,586 B2 3/2007 Savastiouk et al.
(Continued)

FOREIGN PATENT DOCUMENTS

CN 101286457 10/2008
CN 104582252 4/2015
(Continued)

OTHER PUBLICATIONS

"Office Action of Taiwan Counterpart Application," dated Mar. 15, 2018, p. 1-p. 5, in which the listed references were cited.
(Continued)

*Primary Examiner* — Ishwarbhai B Patel
(74) *Attorney, Agent, or Firm* — JCIPRNET

(57) ABSTRACT

A circuit board includes a composite layer of a non-conductor inorganic material and an organic material, a plurality of conductive structures, a first built-up structure, and a second built-up structure. The composite layer of the non-conductor inorganic material and the organic material has a first surface and a second surface opposite to each other and a plurality of openings. The conductive structures are respectively disposed in the openings of the composite layer of the non-conductor inorganic material and the organic material. The first built-up structure is disposed on the first surface of the composite layer of the non-conductor inorganic material and the organic material and electrically connected to the conductive structures. The second built-up structure is disposed on the second surface of the composite layer of the
(Continued)

non-conductor inorganic material and the organic material and electrically connected to the conductive structures.

10 Claims, 11 Drawing Sheets

Related U.S. Application Data is a division of application No. 13/604,968, filed on Sep. 6, 2012, now Pat. No. 8,946,564.

(51) Int. Cl.
| | |
|---|---|
| H05K 1/11 | (2006.01) |
| H01L 23/498 | (2006.01) |
| H01L 21/48 | (2006.01) |
| H01L 21/683 | (2006.01) |
| H05K 3/46 | (2006.01) |
| H01L 23/14 | (2006.01) |
| H01L 23/15 | (2006.01) |

(52) U.S. Cl.
CPC ...... *H01L 21/4857* (2013.01); *H01L 21/6835* (2013.01); *H01L 23/147* (2013.01); *H01L 23/49822* (2013.01); *H01L 23/49838* (2013.01); *H01L 23/49894* (2013.01); *H05K 1/03* (2013.01); *H05K 1/11* (2013.01); *H05K 3/4673* (2013.01); *H01L 23/145* (2013.01); *H01L 23/15* (2013.01); *H01L 23/49816* (2013.01); *H01L 2221/68345* (2013.01); *H01L 2221/68359* (2013.01); *H01L 2224/131* (2013.01); *H01L 2224/16237* (2013.01); *H01L 2224/32225* (2013.01); *H01L 2224/73204* (2013.01); *H01L 2924/15311* (2013.01); *H01L 2924/15313* (2013.01); *H01L 2924/3511* (2013.01); *H05K 1/0271* (2013.01); *H05K 1/0306* (2013.01); *H05K 1/0313* (2013.01); *H05K 3/4682* (2013.01); *H05K 3/4694* (2013.01); *H05K 2201/10674* (2013.01); *Y10T 29/49165* (2015.01)

(58) Field of Classification Search
CPC ............. H01L 21/6835; H01L 21/4857; H01L 23/49838; H01L 21/486; H01L 2924/15313; H01L 2924/3511; H01L 23/145; H01L 23/15; H01L 23/49816; H01L 2924/15311; H01L 2224/73204; H01L 2224/32225; H01L 2224/16237; H01L 2224/131; H01L 2221/68345; H01L 2221/68359; H05K 3/4673; H05K 1/0271; H05K 3/4682; H05K 3/4694; H05K 2201/10674; H05K 1/0284; H05K 1/03; H05K 1/0306; H05K 1/0313; H05K 1/0373; H05K 1/11; H05K 1/111; H05K 1/112; H05K 1/113; H05K 1/115; H05K 1/119; H05K 1/144; H05K 2201/01; H05K 2201/0206; H05K 2201/0209; H05K 2201/0104; H05K 2201/0212; H05K 2201/095; H05K 2201/09827; Y10T 29/49165

See application file for complete search history.

(56) References Cited

U.S. PATENT DOCUMENTS

| | | | |
|---|---|---|---|
| 7,351,916 B2* | 4/2008 | Hsu | H01L 23/49822 174/260 |
| 7,462,784 B2 | 12/2008 | Kariya et al. | |
| 7,619,316 B2 | 11/2009 | Ueda et al. | |
| 8,426,961 B2 | 4/2013 | Shih et al. | |
| 2005/0102831 A1* | 5/2005 | Saiki | H05K 3/381 29/852 |
| 2005/0263867 A1* | 12/2005 | Kambe | H01L 23/49822 257/678 |
| 2006/0120020 A1* | 6/2006 | Dowgiallo, Jr. | H01G 4/30 361/313 |
| 2007/0119619 A1* | 5/2007 | Nakamura | H05K 3/4688 174/262 |
| 2007/0256858 A1 | 11/2007 | Kariya et al. | |
| 2009/0258161 A1* | 10/2009 | Japp | H05K 3/4602 427/555 |
| 2009/0273073 A1* | 11/2009 | Tachibana | H01L 21/563 257/692 |
| 2009/0324658 A1* | 12/2009 | Nohata | A61K 8/06 424/401 |
| 2010/0025093 A1* | 2/2010 | Maruyama | H01L 23/49822 174/258 |
| 2011/0155433 A1* | 6/2011 | Funaya | H05K 1/115 174/258 |
| 2012/0073870 A1 | 3/2012 | Jeon et al. | |
| 2012/0227627 A1* | 9/2012 | Jeong | C09C 1/0015 106/417 |
| 2013/0062108 A1* | 3/2013 | Kondo | H01L 21/4857 174/258 |
| 2015/0083476 A1* | 3/2015 | Kim | H05K 1/113 174/260 |
| 2017/0362740 A1* | 12/2017 | Gazquez | D01D 5/003 |

FOREIGN PATENT DOCUMENTS

| | | |
|---|---|---|
| TW | I233145 | 5/2005 |
| TW | 201539596 | 10/2015 |
| TW | I538581 | 6/2016 |

OTHER PUBLICATIONS

"Office Action of Taiwan Counterpart Application," dated Jul. 10, 2017, p. 1-p. 5, in which the listed references were cited.
"Office Action of China Counterpart Application," dated Aug. 5, 2019, p. 1-p. 9.

* cited by examiner

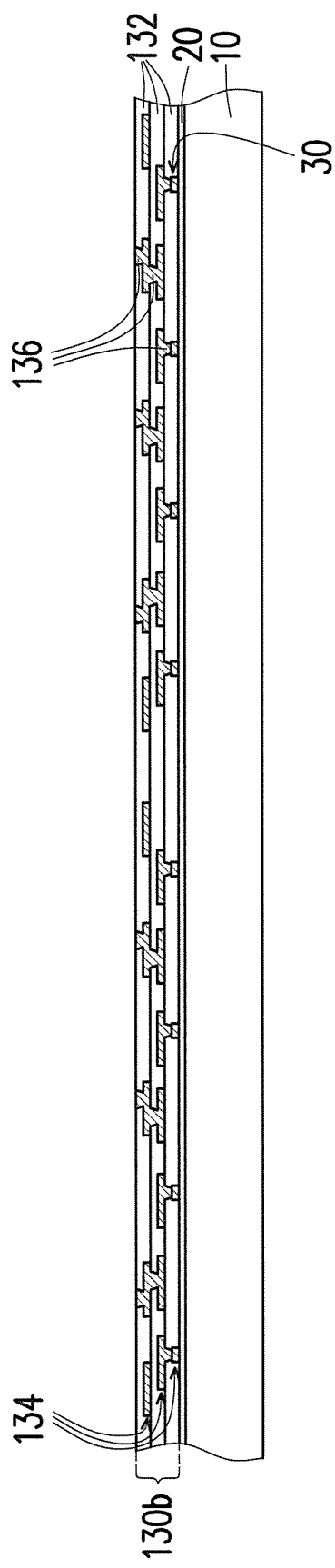
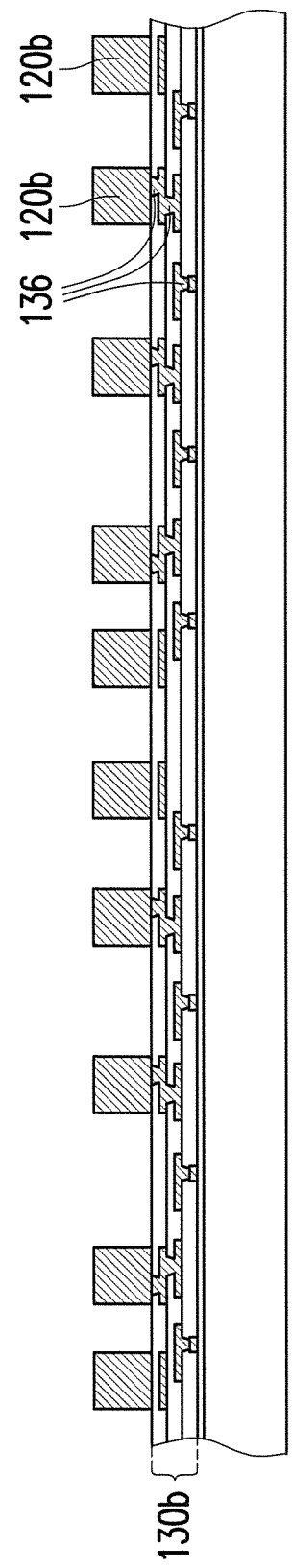

CIRCUIT BOARD AND MANUFACTURING METHOD THEREOF

CROSS-REFERENCE TO RELATED APPLICATION

This application is a continuation-in-part application of and claims the priority benefit of U.S. application Ser. No. 14/602,656, filed on Jan. 22, 2015, now issued, which is a divisional application of and claims the priority benefit of U.S. application Ser. No. 13/604,968, filed on Sep. 6, 2012, now patented as U.S. Pat. No. 8,946,564. The prior application Ser. No. 13/604,968 claims the priority benefit of Taiwan application serial no. 100139667, filed on Oct. 31, 2011. This application also claims the priority benefit of Taiwan application serial no. 105133848, filed on Oct. 20, 2016. The entirety of each of the above-mentioned patent applications is hereby incorporated by reference herein and made a part of this specification.

BACKGROUND OF THE INVENTION

Field of the Invention

The invention relates to a circuit board and a manufacturing method thereof, and particularly relates to a circuit board with a better structural strength and a manufacturing method thereof.

Description of Related Art

Vias are usually made in a silicon or glass substrate in stacked semiconductor device packages, such as through silicon vias (TSV), and redistribution layers are made on a surface of the silicon or glass substrate to complete the fabrication of an interposer. The interposer is bonded to a package carrier board by a mount method or integrated to the package carrier board by an embedded method. However, the material of the interposer with silicon or glass as a substrate has a fragile problem, which may relatively affect structural reliability. Additionally, since a thermal expansion coefficient of an encapsulation adhesive used in a sealing process is different from that of the interposer, different amounts of expansion or contraction between the interposer and the encapsulation adhesive will be generated with temperature change in a curing process after packaging, thereby resulting in the warpage of the interposer.

SUMMARY OF THE INVENTION

The invention provides a circuit board, which can be used as an interposer or a package carrier board, having a better structural strength.

The invention also provides a manufacturing method of a circuit board, used to manufacture the aforementioned circuit board.

The invention provides a circuit board including a composite layer of a non-conductor inorganic material and an organic material, a plurality of conductive structures, a first built-up structure, and a second built-up structure. The composite layer of the non-conductor inorganic material and the organic material has a first surface and a second surface opposite to each other and a plurality of openings. The conductive structures are respectively disposed in the openings of the composite layer of the non-conductor inorganic material and the organic material. The first built-up structure is disposed on the first surface of the composite layer of the non-conductor inorganic material and the organic material and electrically connected to the conductive structures. The second built-up structure is disposed on the second surface of the composite layer of the non-conductor inorganic material and the organic material and electrically connected to the conductive structures.

According to an embodiment of the invention, a material of the composite layer of the non-conductor inorganic material and the organic material includes a composite material composed of a ceramic material and a polymer material.

According to an embodiment of the invention, the ceramic material includes zirconia, aluminum oxide, silicon nitride, silicon carbide, silicon oxide, or a combination thereof, and the polymer material includes epoxy resins, polyimide, liquid crystal polymers, methacrylate resins, vinyl phenyl resins, allyl resins, polyacrylate resins, polyether resins, polyolefin resins, polyamide resins, polysiloxane resins, or a combination thereof.

According to an embodiment of the invention, the composite layer of the non-conductor inorganic material and the organic material is an imitation nacreous layer.

According to an embodiment of the invention, a Young's modulus of the composite layer of the non-conductor inorganic material and the organic material is between 20 GPa and 100 GPa.

According to an embodiment of the invention, the circuit board further includes a plurality of pads disposed on the second surface of the composite layer of the non-conductor inorganic material and the organic material and electrically connected to the conductive structures, wherein the openings are a plurality of blind holes. A portion of the first built-up structure is embedded in the first surface of the composite layer of the non-conductor inorganic material and the organic material. The pads are electrically connected to the first built-up structure through the conductive structures.

According to an embodiment of the invention, the openings are a plurality of through vias connected to the first surface and the second surface of the composite layer of the non-conductor inorganic material and the organic material. The conductive structures are a plurality of conductive pillars. The first built-up structure is electrically connected to the second built-up structure through the conductive pillars.

According to an embodiment of the invention, the first built-up structure includes at least a first dielectric layer, at least a first patterned conductive layer, and at least a first conductive hole structure penetrating the first dielectric layer. The first dielectric layer and the first patterned conductive layer are sequentially stacked on the first surface of the composite layer of the non-conductor inorganic material and the organic material, and the first patterned conductive layer is electrically connected to the conductive structures through the first conductive hole structure.

According to an embodiment of the invention, the second built-up structure includes at least a second dielectric layer, at least a second patterned conductive layer, and at least a second conductive hole structure penetrating the second dielectric layer. The second dielectric layer and the second patterned conductive layer are sequentially stacked on the second surface of the composite layer of the non-conductor inorganic material and the organic material, and the second patterned conductive layer is electrically connected to the conductive structures through the second conductive hole structure.

According to an embodiment of the invention, the circuit board further includes a solder mask layer and a surface treatment layer. The solder mask layer is disposed on the second built-up structure, wherein the solder mask layer exposes a portion of the second built-up structure. The surface treatment layer is disposed on the second built-up structure exposed by the solder mask layer.

The invention provides a manufacturing method of a circuit board including the following steps. A support plate is provided. The support plate is provided with a temporary adhesive layer and a patterned circuit layer located on the temporary adhesive layer thereon. A first built-up structure is formed on the temporary adhesive layer and electrically connected to the patterned circuit layer. A composite layer of a non-conductor inorganic material and an organic material and a plurality of conductive structures are disposed on the first built-up structure, wherein the composite layer of the non-conductor inorganic material and the organic material covers the conductive structures, and the conductive structures are electrically connected to the first built-up structure. A second built-up structure is formed on the composite layer of the non-conductor inorganic material and the organic material, wherein the second built-up structure is electrically connected to the first built-up structure through the conductive structures. The support plate and the temporary adhesive layer are removed, so as to expose a surface of the first built-up structure and the patterned circuit layer.

According to an embodiment of the invention, a material of the composite layer of the non-conductor inorganic material and the organic material includes a composite material composed of a ceramic material and a polymer material.

According to an embodiment of the invention, the ceramic material includes zirconia, aluminum oxide, silicon nitride, silicon carbide, silicon oxide, or a combination thereof, and the polymer material includes epoxy resins, polyimide, liquid crystal polymers, methacrylate resins, vinyl phenyl resins, allyl resins, polyacrylate resins, polyether resins, polyolefin resins, polyamide resins, polysiloxane resins, or a combination thereof.

According to an embodiment of the invention, the composite layer of the non-conductor inorganic material and the organic material is an imitation nacreous layer.

According to an embodiment of the invention, a Young's modulus of the composite layer of the non-conductor inorganic material and the organic material is between 20 GPa and 100 GPa.

According to an embodiment of the invention, the step of disposing the composite layer of the non-conductor inorganic material and the organic material and the conductive structures on the first built-up structure includes the following steps. The composite layer of the non-conductor inorganic material and the organic material is disposed on the first built-up structure. The composite layer of the non-conductor inorganic material and the organic material has a plurality of blind holes, and the blind holes expose a portion of the first built-up structure. The conductive structures are formed on the first built-up structure and located in the blind holes, wherein the conductive structures are electrically connected to the first built-up structure exposed by the blind holes.

According to an embodiment of the invention, while forming the conductive structures, a plurality of pads are formed on the composite layer of the non-conductor inorganic material and the organic material. The pads are electrically connected to the first built-up structure through the conductive structures.

According to an embodiment of the invention, the step of disposing the composite layer of the non-conductor inorganic material and the organic material and the conductive structures on the first built-up structure includes the following steps. The conductive structures are formed on the first built-up structure, wherein the conductive structures are a plurality of conductive pillars. The composite layer of the non-conductor inorganic material and the organic material is formed on the first built-up structure and covers the conductive pillars, wherein a first surface and a second surface opposite to each other of the composite layer of the non-conductor inorganic material and the organic material are respectively trimmed with a third surface and a fourth surface of each of the conductive pillars.

According to an embodiment of the invention, the step of disposing the composite layer of the non-conductor inorganic material and the organic material and the conductive structures on the first built-up structure includes the following steps. A composite material layer of a non-conductor inorganic material and an organic material is provided. The composite material layer of the non-conductor inorganic material and the organic material has an upper surface and a lower surface opposite to each other. A plurality of blind holes are formed at the upper surface of the composite material layer of the non-conductor inorganic material and the organic material. A conductive material layer is formed on the upper surface of the composite material layer of the non-conductor inorganic material and the organic material and in the blind holes, wherein the conductive material layer fills the blind holes. A portion of the conductive material layer and a portion of the composite material layer of the non-conductor inorganic material and the organic material are removed, so as to form the composite layer of the non-conductor inorganic material and the organic material and the conductive structure, wherein the conductive structures are a plurality of conductive pillars. A first surface and a second surface opposite to each other of the composite layer of the non-conductor inorganic material and the organic material are respectively trimmed with a third surface and a fourth surface of each of the conductive pillars. The composite layer of the non-conductor inorganic material and the organic material and the conductive structures are disposed on the first built-up structure.

According to an embodiment of the invention, the first built-up structure includes at least a first dielectric layer, at least a first patterned conductive layer, and at least a first conductive hole structure penetrating the first dielectric layer. The first dielectric layer and the first patterned conductive layer are sequentially stacked on the temporary adhesive layer, and the first patterned conductive layer is electrically connected to the patterned circuit layer through the first conductive hole structure.

According to an embodiment of the invention, the second built-up structure includes at least a second dielectric layer, at least a second patterned conductive layer, and at least a second conductive hole structure penetrating the second dielectric layer. The second dielectric layer and the second patterned conductive layer are sequentially stacked on the composite layer of the non-conductor inorganic material and the organic material, and the second patterned conductive layer is electrically connected to the conductive structures through the second conductive hole structure.

According to an embodiment of the invention, after forming the second built-up structure on the composite layer of the non-conductor inorganic material and the organic material and before removing the support plate and the temporary adhesive layer, the manufacturing method further includes the following steps. A solder mask layer is formed on the second built-up structure, wherein the solder mask layer exposes a portion of the second built-up structure. A surface treatment layer is formed on the second built-up structure exposed by the solder mask layer.

Based on the above, since the circuit board of the invention has two built-up structures respectively disposed on two opposite surfaces of the composite layer of the non-conductor inorganic material and the organic material, that is, the composite layer of the non-conductor inorganic material and the organic material can be regarded as a strengthened layer, which has a higher hardness compared with a normal dielectric layer and encapsulating material. Thus, the overall structural strength of the circuit board of the invention can be enhanced through the composite layer of the non-conductor inorganic material and the organic material, so as to prevent the carrier board from warping phenomenon, thereby improving the process yield.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A to FIG. 3F are schematic cross-sectional views illustrating some steps of a manufacturing method of a circuit board according to another embodiment of the invention.

DESCRIPTION OF THE EMBODIMENTS

Figure 1A:
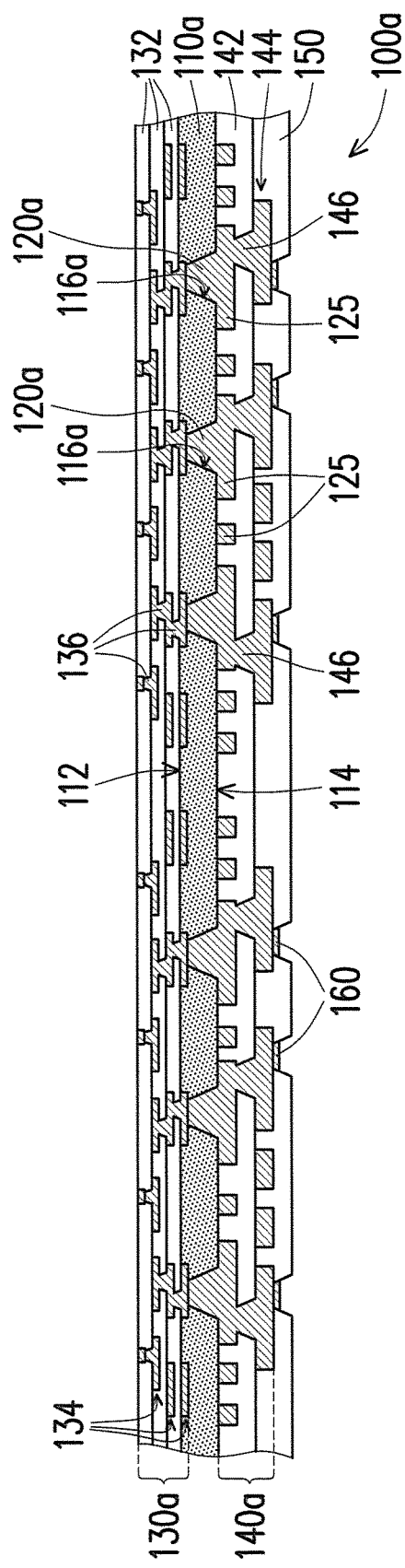
FIG. 1A is a schematic cross-sectional view illustrating a circuit board according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1A is a schematic cross-sectional view illustrating a circuit board according to an embodiment of the invention. Referring to FIG. 1A, in the embodiment, a circuit board 100a includes a composite layer of a non-conductor inorganic material and an organic material 110a, a plurality of conductive structures 120a, a first built-up structure 130a, and a second built-up structure 140a. The composite layer of the non-conductor inorganic material and the organic material 110a has a first surface 112 and a second surface 114 opposite to each other and a plurality of openings 116a. The conductive structures 120a are respectively disposed in the openings 116a of the composite layer of the non-conductor inorganic material and the organic material 110a. The first built-up structure 130a is disposed on the first surface 112 of the composite layer of the non-conductor inorganic material and the organic material 110a and electrically connected to the conductive structures 120a. The second built-up structure 140a is disposed on the second surface 114 of the composite layer of the non-conductor inorganic material and the organic material 110a and electrically connected to the conductive structures 120a.

Specifically, a material of the composite layer of the non-conductor inorganic material and the organic material 110a of the embodiment is a composite material composed of a ceramic material and a polymer material, for example. The ceramic material includes zirconia, aluminum oxide, silicon nitride, silicon carbide, silicon oxide, or a combination thereof, and the polymer material includes epoxy resins, polyimide, liquid crystal polymers, methacrylate resins, vinyl phenyl resins, allyl resins, polyacrylate resins, polyether resins, polyolefin resins, polyamide resins, polysiloxane resins, or a combination thereof. The ceramic material may be ceramic layers or ceramic powders, but the ceramic material of the embodiment is not limited thereto. The composite layer of the non-conductor inorganic material and the organic material 110a may be an imitation nacreous layer. Herein, a Youngs modulus of the composite layer of the non-conductor inorganic material and the organic material 110a is between 20 GPa and 100 GPa, for example. Compared with a commonly used dielectric layer (with a Young's modulus not more than 10 GPa) and an encapsulating material (with a Young's modulus not more than 20 GPa), the composite layer of the non-conductor inorganic material and the organic material 110a of the embodiment has an excellent hardness, such that a structural strength of the circuit board 100a can be effectively enhanced.

Furthermore, the circuit board 100a of the embodiment further includes a plurality of pads 125. The pads 125 are disposed on the second surface 114 of the composite layer of the non-conductor inorganic material and the organic material 110a and electrically connected to the conductive structures 120a. Herein, the openings 116a of the composite layer of the non-conductor inorganic material and the organic material 110a may be a plurality of blind holes. A portion of the first built-up structure 130a is embedded in the first surface 112 of the composite layer of the non-conductor inorganic material and the organic material 110a, and the pads 125 are electrically connected to the first built-up structure 130a through the conductive structure 120a.

Furthermore, referring to FIG. 1A again, the first built-up structure 130a of the embodiment includes at least a first dielectric layer 132 (three first dielectric layers are schematically illustrated in FIG. 1A), at least a first patterned conductive layer 134 (three first patterned conductive layers are schematically illustrated in FIG. 1A), and at least a first conductive hole structure 136 (a plurality of first conductive hole structures are schematically illustrated in FIG. 1A) penetrating the first dielectric layer 132. The first dielectric layer 132 and the first patterned conductive layer 134 are sequentially stacked on the first surface 112 of the composite layer of the non-conductor inorganic material and the organic material 110a, and the first patterned conductive layer 134 is electrically connected to the conductive structures 120a through the first conductive hole structure 136.

On the other hand, the second built-up structure 140a of the embodiment includes at least a second dielectric layer 142 (one second dielectric layer is schematically illustrated in FIG. 1A), at least a second patterned conductive layer 144 (one second patterned conductive layer is schematically illustrated in FIG. 1A), and at least a second conductive hole structure 146 (a plurality of second conductive hole structures are schematically illustrated in FIG. 1A) penetrating the second dielectric layer 142. The second dielectric layer 142 and the second patterned conductive layer 144 are sequentially stacked on the second surface 114 of the composite layer of the non-conductor inorganic material and the organic material 110a, and the second patterned conductive layer 144 is electrically connected to the conductive structures 120a through the second conductive hole structure 146.

Additionally, the circuit board 100a of the embodiment further includes a solder mask layer 150 and a surface treatment layer 160. The solder mask layer 150 is disposed on the second built-up structure 140a, wherein the solder mask layer 150 exposes a portion of the second built-up structure 140a. The surface treatment layer 160 is disposed on the second built-up structure 140a exposed by the solder mask layer 150.

Since the first built-up structure 130a and the second built-up structure 140a are respectively disposed on the first surface 112 and the second surface 114 of the composite layer of the non-conductor inorganic material and the organic material 110a of the circuit board 100a of the embodiment, that is, the composite layer of the non-conductor inorganic material and the organic material 110a can be regarded as a strengthened layer, which has a higher hardness compared with a normal dielectric layer and encapsulating material. Thus, the overall structural strength of the circuit board 100a of the embodiment can be enhanced through the composite layer of the non-conductor inorganic material and the organic material 110a, so as to prevent the carrier board from warping phenomenon, thereby improving the process yield.

It should be note that, the reference numerals and some content of the foregoing embodiments are still used in the following embodiments, where the same reference numerals are used to denote the same or similar elements, and the illustration of the same technical contents is omitted. The omitted parts are as described in the foregoing embodiments, and will not be described herein again.

Figure 1B:
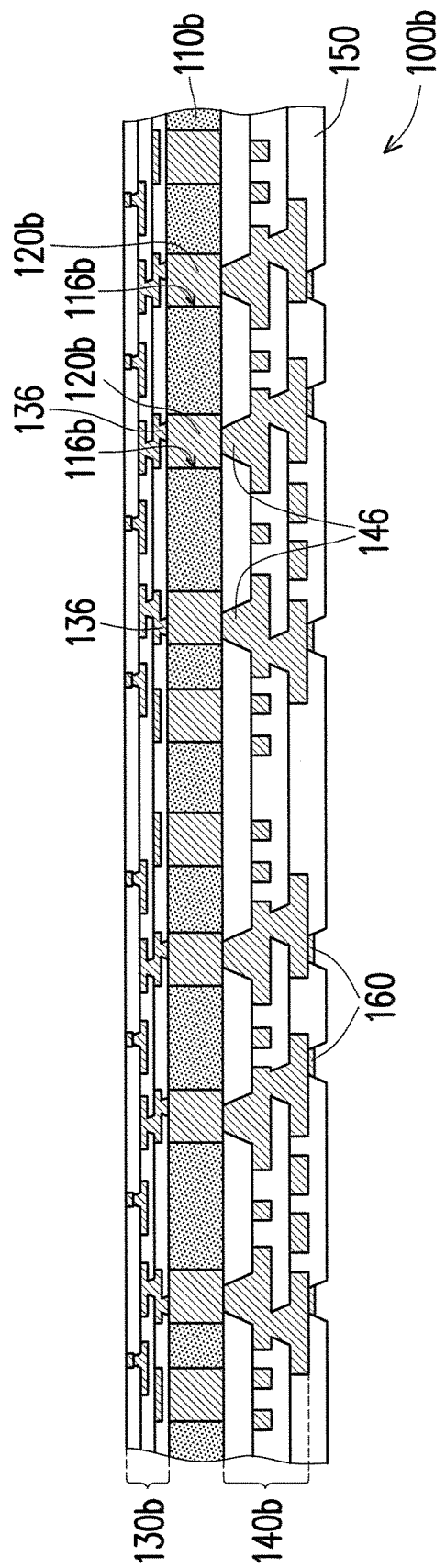
FIG. 1B is a schematic cross-sectional view illustrating a circuit board according to another embodiment of the invention.

FIG. 1B is a schematic cross-sectional view illustrating a circuit board according to another embodiment of the invention. Referring to FIG. 1A and FIG. 1B at the same time, a circuit board 100b of the embodiment is similar to the circuit board 100a of FIG. 1A, and the difference between the two is that, openings 116b of a composite layer of the non-conductor inorganic material and the organic material 110b of the embodiment may be a plurality of through vias connected to the first surface 112 and the second surface 114 of the composite layer of the non-conductor inorganic material and the organic material 110b. Conductive structures 120b may be a plurality of conductive pillars, and the first conductive hole structure 136 of a first built-up structure 130b is electrically connected to the second conductive hole structure 146 of a second built-up structure 140b through the conductive structures (i.e., conductive pillars) 120b.

The manufacturing methods of the circuit board 100a and 100b will be respectively described in two embodiments, and the manufacturing methods of the circuit board 100a and 100b will be described in detail with reference to FIG. 2A to FIG. 2G and FIG. 3A to FIG. 3F.

Figure 2A:
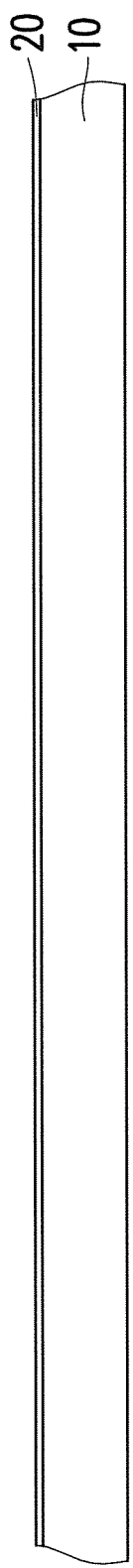
FIG. 2A to FIG. 2G are schematic cross-sectional views illustrating a manufacturing method of a circuit board according to an embodiment of the invention.

FIG. 2A to FIG. 2G are schematic cross-sectional views illustrating a manufacturing method of a circuit board according to an embodiment of the invention. Referring to FIG. 2A, according to the manufacturing method of the circuit board 100a of the embodiment, first, a support plate 10 is provided, wherein a temporary adhesive layer 20 is provided on the support plate 10. Herein, the support plate 10 is a glass substrate, a silicon substrate, or a copper foil substrate, for example, but the invention is not limited thereto.

Figure 2B:
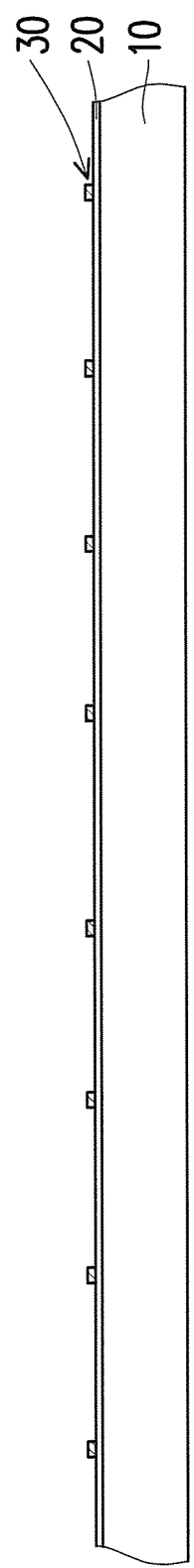

Then, referring to FIG. 2B, a patterned circuit layer 30 is formed on the temporary adhesive layer 20, wherein the patterned circuit layer 30 exposes a portion of the temporary adhesive layer 20. Herein, a method of forming the patterned circuit layer 30 includes sputtering titanium/copper and a lithography yellow light process.

Figure 2C:
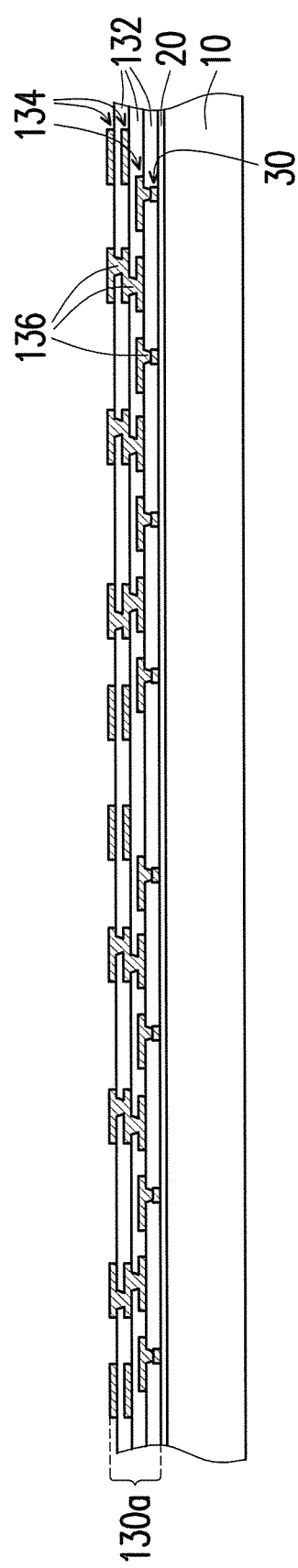

Then, referring to FIG. 2C, the first built-up structure 130a is formed on the temporary adhesive layer 20 and electrically connected to the patterned circuit layer 30. Herein, the first built-up structure 130a includes three first dielectric layers 132, three first patterned conductive layers 134, and a plurality of first conductive hole structures 136 penetrating the first dielectric layer 132. The first dielectric layer 132 and the first patterned conductive layer 134 are sequentially stacked on the temporary adhesive layer 20, and the first patterned conductive layer 134 is electrically connected to the patterned circuit layer 30 through the first conductive hole structure 136.

Figure 2D:
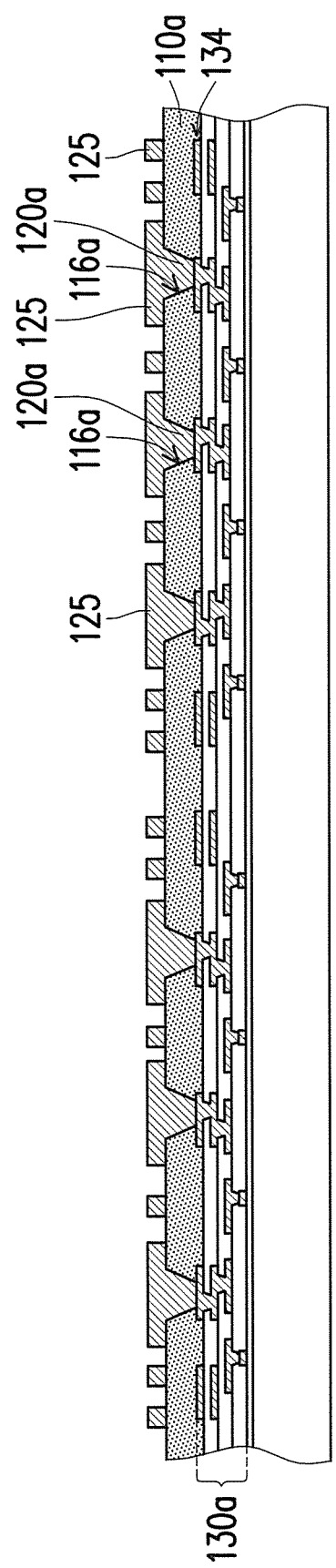

Then, referring to FIG. 2D, the composite layer of the non-conductor inorganic material and the organic material 110a and a plurality of the conductive structures 120a are disposed on the first built-up structure 130a, wherein the composite layer of the non-conductor inorganic material and the organic material 110a covers the conductive structures 120a, and the conductive structures 120a are electrically connected to the first built-up structure 130a.

Specifically, the step of disposing the composite layer of the non-conductor inorganic material and the organic material 110a and the conductive structures 120a on the first built-up structure 130a includes the following steps. The composite layer of the non-conductor inorganic material and the organic material 110a is disposed on the first built-up structure 130a first, wherein the composite layer of the non-conductor inorganic material and the organic material 110a has a plurality of blind holes (i.e., openings 116a). The blind holes (i.e., openings 116a) expose a portion of the first built-up structure 130a. That is, the first patterned conductive layer 134 of the first built-up structure 130a is exposed.

Then, the conductive structures 120a are formed on the first built-up structure 130a and located in the blind holes (i.e., openings 116a), wherein the conductive structures 120a are electrically connected to the first built-up structure 130a exposed by the blind holes (i.e., openings 116a). Herein, while forming the conductive structures 120a, a plurality of the pads 125 are further formed on the composite layer of the non-conductor inorganic material and the organic material 110a, wherein the pads 125 are electrically connected to the first built-up structure 130a through the conductive structures 120a.

Furthermore, the material of the composite layer of the non-conductor inorganic material and the organic material 110a of the embodiment is a composite material composed of a ceramic material and a polymer material, for example. The ceramic material includes zirconia, aluminum oxide, silicon nitride, silicon carbide, silicon oxide, or a combination thereof, and the polymer material includes epoxy resins, polyimide, liquid crystal polymers, methacrylate resins, vinyl phenyl resins, allyl resins, polyacrylate resins, polyether resins, polyolefin resins, polyamide resins, polysiloxane resins, or a combination thereof. The ceramic material may be ceramic layers or ceramic powders, but the ceramic material of the embodiment is not limited thereto. In the embodiment of the ceramic powders, the polymer material can be impregnated in the ceramic powders using a vacuum dipping technique in the manufacturing method of the composite layer of the non-conductor inorganic material and the organic material 110a, so as to manufacture the composite layer of the non-conductor inorganic material and the organic material 110a composed of a composite material formed of the ceramic powders and the polymer material. Then, the composite layer of the non-conductor inorganic material and the organic material 110a is disposed on the first built-up structure 130 by hot pressing or vacuum dipping and then irradiating with ultraviolet light and heating, which will be described more detail in FIG. 3C subsequently, but is not limited thereto. In the embodiment of the ceramic layers, the polymer material can be impregnated in the ceramic layers using a vacuum dipping technique in the manufacturing method of the composite layer of the non-conductor inorganic material and the organic material 110a, so as to manufacture the composite layer of the non-conductor inorganic material and the organic material 110a composed of a composite material formed of the ceramic layers and the polymer material. However, the manufacturing method of the composite layer of the non-conductor inorganic material and the organic material 110a of the embodiment is not limited thereto. It can also be used other methods capable of forming the composite material from the polymer material and the ceramic material. In the embodiment of the ceramic layers, more specifically, the composite layer of the non-conductor inorganic material and the organic material 110a includes a composite composition of an organic matter and an inorganic matter (e.g., a composite composition of the polymer material and the ceramic layers). Based on the adhesion of the organic matter to the inorganic matter, the ceramic layers of the composite layer of the non-conductor inorganic material and the organic material 110a has a microscopic laminated structure in a sheet-shape, a brick-shape, or a combination thereof arrangement. The arrangement suppresses the conduction of transverse rupture forces, thereby significantly improving its hardness. Therefore, the material is strong and has flexibility, which is able to increase ceramic strength and improve ceramic brittleness, and with excellent toughness at the same time. The composite layer of the non-conductor inorganic material and the organic material 110a may be an imitation nacreous layer. Herein, a Young's modulus of the composite layer of the non-conductor inorganic material and the organic material 110a is between 20 GPa and 100 GPa, for example.

In an embodiment of the invention, the blind holes 116a are formed by laser. In another embodiment of the invention, a bottom hole diameter of the blind holes 116a is 10 μm, for example. For the length of a single sheet-shape or brick-shape ceramic layer relative to the bottom hole diameter, the ratio of the former to the latter of 0.1 or less can be chosen. Thus, the length of the ceramic layer can be relative to 0.3~1 μm (300 nm~1000 nm), and the thickness thereof can be relative to 0.03~0.1 μm (30 nm~100 nm). The polymer material is a photosensitive resin composition including such as an epoxy-based resin and an imide-based resin, for example. The ultraviolet light energy consumption can be significantly reduced while the sheet-shape or brick-shape ceramic layer adopted the photosensitive resin composition that exposure energy of ultraviolet light wavelength can be transparent (e.g., quartz material with high ultraviolet light wavelength transmittance). After the sheet-shape or brick-shape ceramic layer of the laminated structure is impregnated in the photosensitive resin composition and after positions of the blind holes 116a to be formed are exposed, the blind holes 116a are formed using ultrasonic developing solution blisters or pulse developing solution spouts with effects of washing away the resin at the positions of the blind holes 116a and cleaning the sheet-shape or brick-shape ceramic layer of the laminated structure at the positions of the blind holes 116a.

Figure 2E:
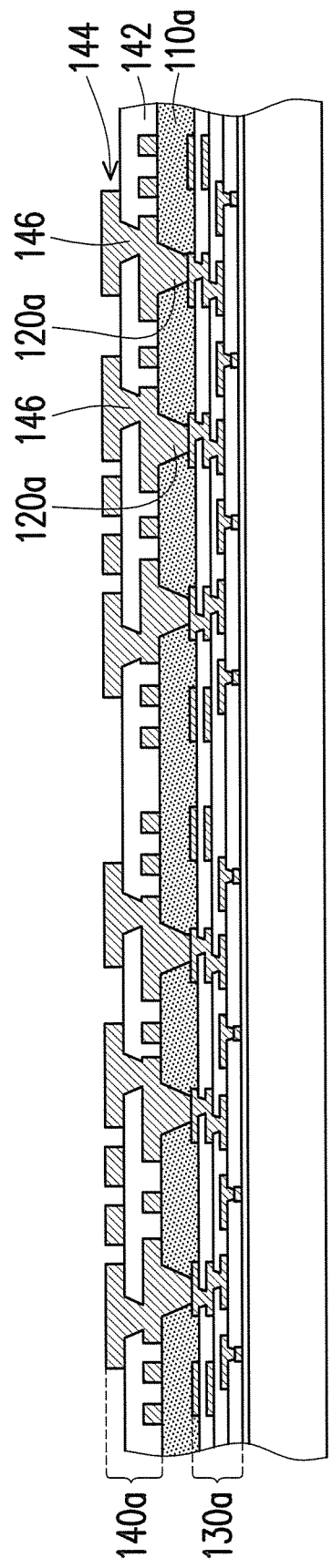

Then, referring to FIG. 2E, the second built-up structure 140a is formed on the composite layer of the non-conductor inorganic material and the organic material 110a, wherein the second built-up structure 140a is electrically connected to the first built-up structure 130a through the conductive structures 120a. Herein, the second built-up structure 140a includes one second dielectric layer 142, one second patterned conductive layer 144, and a plurality of second conductive hole structures 146 penetrating the second dielectric layer 142. The second dielectric layer 142 and the second patterned conductive layer 144 are sequentially stacked on the composite layer of the non-conductor inorganic material and the organic material 110a, and the second patterned conductive layer 144 is electrically connected to the conductive structures 120a through the second conductive hole structure 146.

Figure 2F:
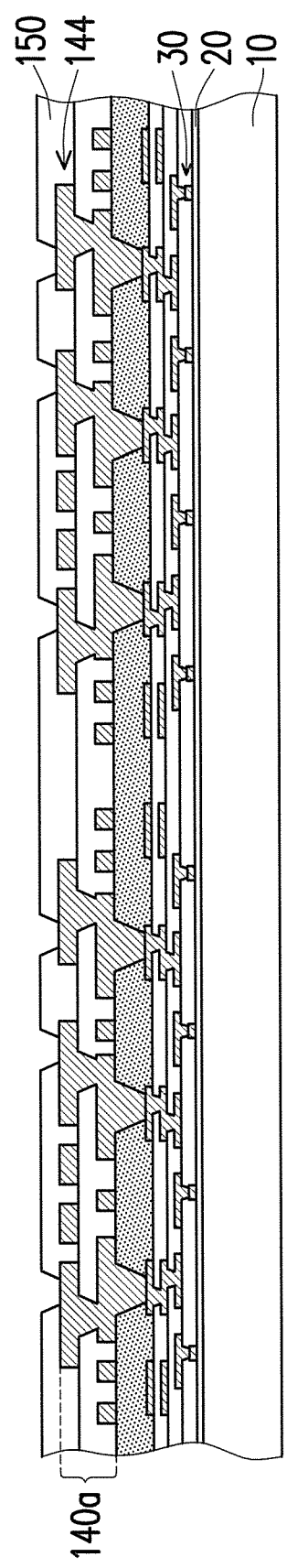

Then, referring to FIG. 2F, the solder mask layer 150 is formed on the second built-up structure 140a, wherein the solder mask layer 150 exposes a portion of the second built-up structure 140a. That is, the solder mask layer 150 exposes a portion of the second patterned conductive layer 144 of the second built-up structure 140a.

Figure 2G:
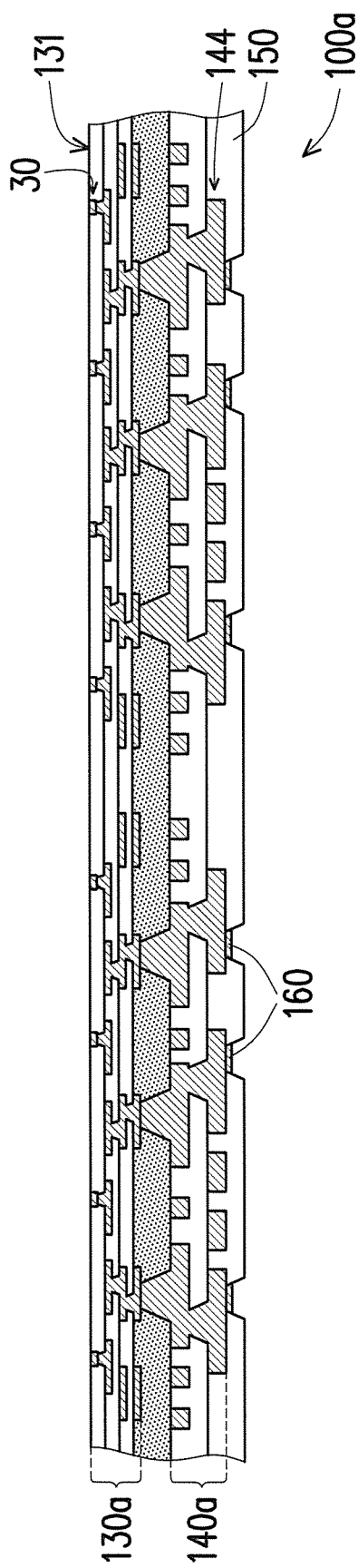

Thereafter, referring to FIG. 2F and FIG. 2G at the same time, the surface treatment layer 160 is formed on the second built-up structure 140a exposed by the solder mask layer 150. That is, the surface treatment layer 160 is formed on the portion of the second patterned conductive layer 144 of the second built-up structure 140a exposed by the solder mask layer 150. At last, the support plate 10 and the temporary adhesive layer 20 are removed to expose a surface 131 of the first built-up structure 130a and the patterned circuit layer 30. At this point, the fabrication of the circuit board 100a has been completed.

Figure 2H:
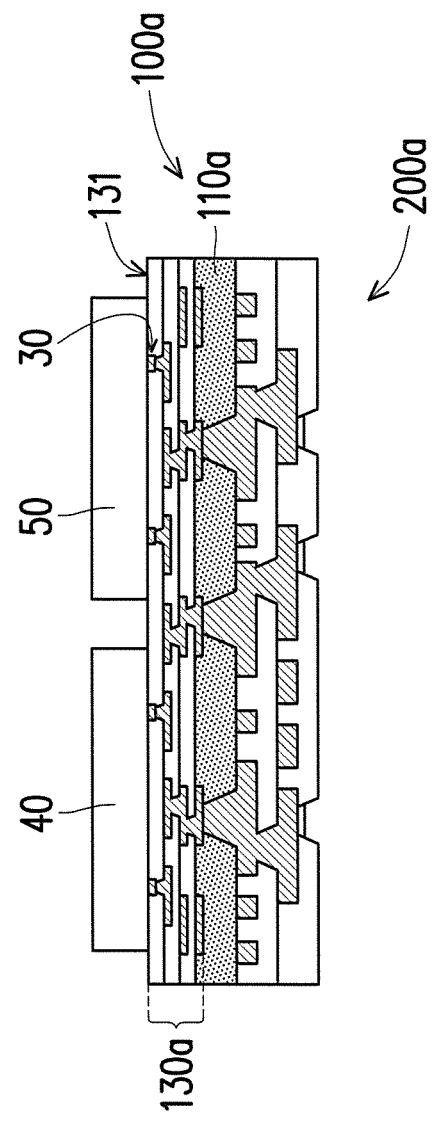
FIG. 2H is a schematic cross-sectional view illustrating the circuit board of FIG. 2G carrying at least a chip.

FIG. 2H is a schematic cross-sectional view illustrating the circuit board of FIG. 2G carrying at least a chip. Referring to FIG. 2G and FIG. 2H at the same time, the circuit board 100a of FIG. 2G is suitable for carrying at least a chip (only two chips 40 and 50 are schematically illustrated in FIG. 2H), wherein the chips 40 and 50 are suitable for disposing on the surface 131 of the first built-up structure 130a and being electrically connected to the patterned circuit layer 30. Thereafter, by a monomer process, a package structure 200a of FIG. 2H can be formed. Herein, the chips 40 and 50 are application processor (AP) chips, wide bus bar (wide I/O) chips, or a combination thereof, for example, but are not limited thereto.

Since the chips 40 and 50 are disposed on the circuit board 100a with the composite layer of the non-conductor inorganic material and the organic material 110a in the package structure 200a of the embodiment, the composite layer of the non-conductor inorganic material and the organic material 110a has a higher hardness compared with a normal dielectric layer and encapsulating material. Thus, the overall structural strength of the package structure 200a of the embodiment can be enhanced through the composite layer of the non-conductor inorganic material and the organic material 110a, so as to prevent the carrier board from warping phenomenon, thereby improving the structural reliability.

FIG. 3A to FIG. 3F are schematic cross-sectional views illustrating some steps of a manufacturing method of a circuit board according to another embodiment of the invention. The manufacturing method of the circuit board 100b of the embodiment is similar to that of the circuit board 100a, and the difference between the two is that, after the step of FIG. 2B (i.e., after forming the patterned circuit layer 30), referring to FIG. 3A, the first built-up structure 130b is formed on the temporary adhesive layer 20 and electrically connected to the patterned circuit layer 30. Herein, the first built-up structure 130b includes three first dielectric layers 132, two first patterned conductive layers 134, and a plurality of first conductive hole structures 136 penetrating the first dielectric layer 132. The first dielectric layer 132 and the first patterned conductive layer 134 are sequentially stacked on the temporary adhesive layer 20, and the first patterned conductive layer 134 is electrically connected to the patterned circuit layer 30 through the first conductive hole structure 136.

Then, referring to FIG. 3B, the conductive structures 120b are formed on the first built-up structure 130b, wherein the conductive structures 120b may be a plurality of conductive pillars, and the conductive structures 120b are electrically connected to the first conductive hole structure 136 of the first built-up structure 130b.

Figure 3C:
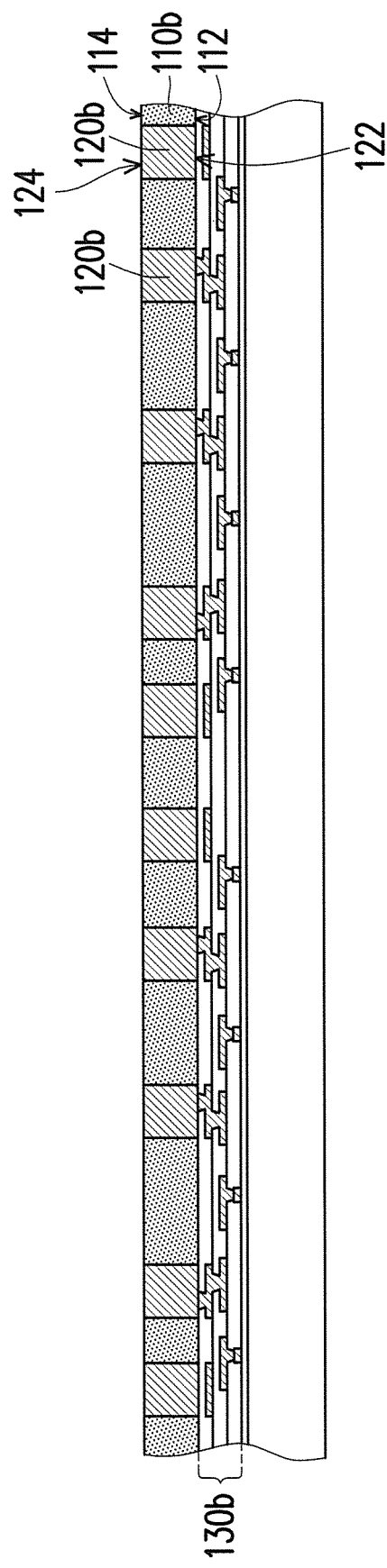

Then, referring to FIG. 3C, the composite layer of the non-conductor inorganic material and an organic material 110b is formed on the first built-up structure 130b and covers the conductive pillars (i.e., conductive structures 120b). The first surface 112 and the second surface 114 opposite to each other of the composite layer of the non-conductor inorganic material and the organic material 110b are respectively trimmed with the third surface 122 and the fourth surface 124 of each of the conductive pillars (i.e., conductive structures 120b).

A material of the composite layer of the non-conductor inorganic material and the organic material 110b of the embodiment is a composite material composed of a ceramic material and a polymer material, for example. In the embodiment that the ceramic material is the ceramic powders, the polymer material can be impregnated in the ceramic powders using a vacuum dipping technique, so as to manufacture the composite layer of the non-conductor inorganic material and the organic material 110b composed of the composite material formed of the ceramic powders and the polymer material. In the embodiment that the polymer material is a photosensitive resin composition including such as an epoxy-based resin and an imide-based resin, for example, the composite layer of the non-conductor inorganic material and the organic material 110b is disposed on the first built-up structure 130 by hot pressing or vacuum dipping and then irradiating with ultraviolet light and heating, for example.

Figure 3D:
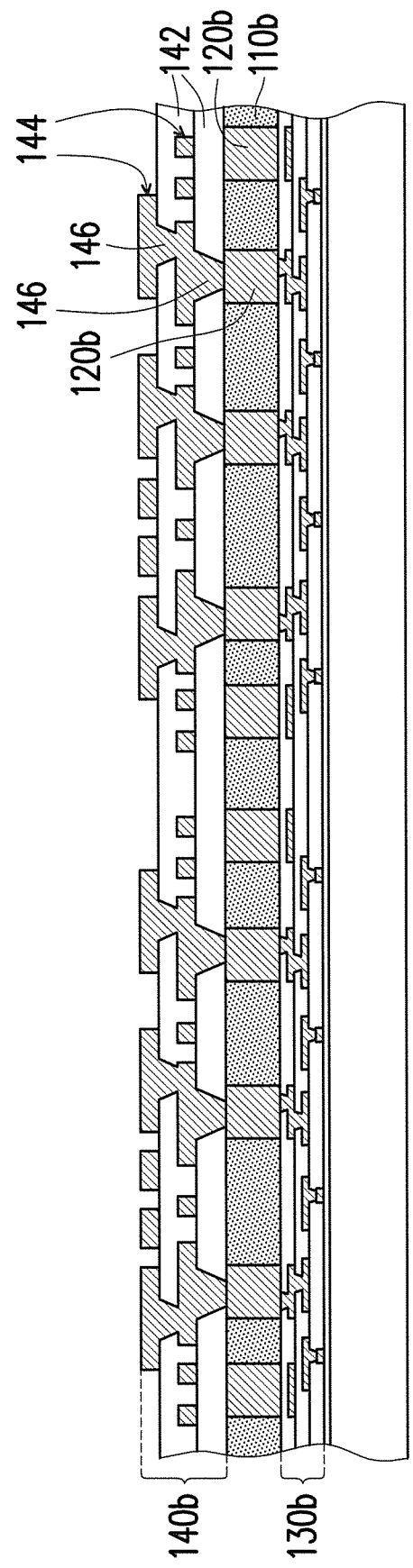

Then, referring to FIG. 3D, the second built-up structure 140b is formed on the composite layer of the non-conductor inorganic material and the organic material 110b, wherein the second built-up structure 140b is electrically connected to the first built-up structure 130b through the conductive structures 120b. Herein, the second built-up structure 140b includes two second dielectric layers 142, two second patterned conductive layers 144, and a plurality of second conductive hole structures 146 penetrating the second dielectric layer 142. The second dielectric layers 142 and the second patterned conductive layers 144 are sequentially stacked on the composite layer of the non-conductor inorganic material and the organic material 110b, and the second patterned conductive layers 144 are electrically connected to the conductive structures 120b through the second conductive hole structures 146.

Figure 3E:
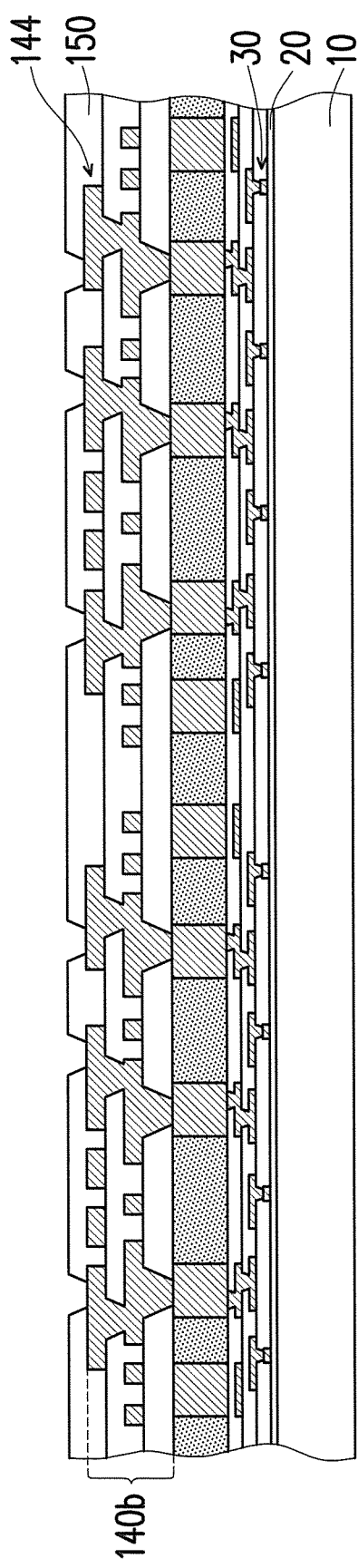

Then, referring to FIG. 3E, the solder mask layer 150 is formed on the second built-up structure 140b, wherein the solder mask layer 150 exposes a portion of the second built-up structure 140b. That is, the solder mask layer 150 exposes the portion of the second patterned conductive layer 144 of the second built-up structure 140b.

Figure 3F:
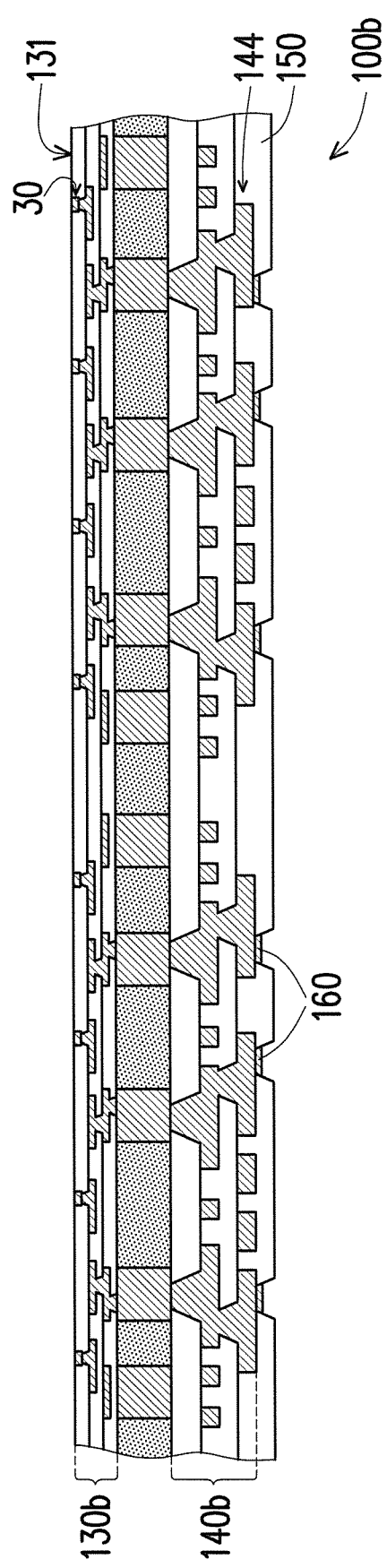

Thereafter, referring to FIG. 3E and FIG. 3F at the same time, the surface treatment layer 160 is formed on the second built-up structure 140b exposed by the solder mask layer 150. That is, the surface treatment layer 160 is formed on the portion of the second patterned conductive layer 144 of the second built-up structure 140b exposed by the solder mask layer 150. At last, the support plate 10 and the temporary adhesive layer 20 are removed to expose the surface 131 of the first built-up structure 130b and the patterned circuit layer 30. At this point, the fabrication of the circuit board 100b has been completed.

Figure 3G:
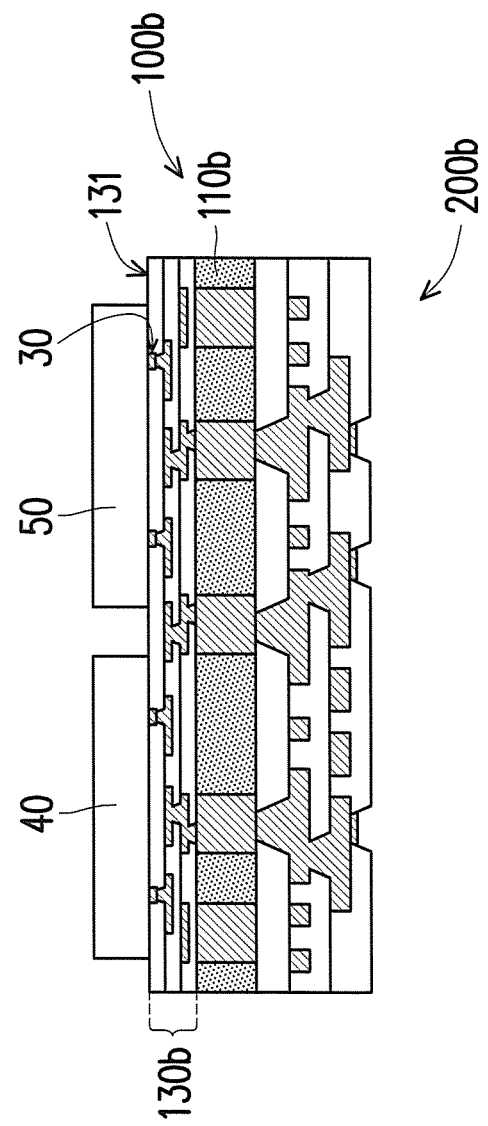
FIG. 3G is a schematic cross-sectional view illustrating the circuit board of FIG. 3F carrying at least a chip.

FIG. 3G is a schematic cross-sectional view illustrating the circuit board of FIG. 3F carrying at least a chip. Referring to FIG. 3F and FIG. 3G at the same time, the circuit board 100b of FIG. 3F is suitable for carrying at least a chip (only two chips 40 and 50 are schematically illustrated in FIG. 3F), wherein the chips 40 and 50 are suitable for disposing on the surface 131 of the first built-up structure 130b and being electrically connected to the patterned circuit layer 30. Thereafter, by a monomer process, a package structure 200b of FIG. 3G can be formed. Herein, the chips 40 and 50 are application processor (AP) chips, wide bus bar (wide I/O) chips, or a combination thereof, but are not limited thereto.

Since the chips 40 and 50 are disposed on the circuit board 100b with the composite layer of the non-conductor inorganic material and the organic material 110b in the package structure 200b of the embodiment, the composite layer of the non-conductor inorganic material and the organic material 110b has a higher hardness compared with a normal dielectric layer and encapsulating material. Thus, the overall structural strength of the package structure 200b of the embodiment can be enhanced through the composite layer of the non-conductor inorganic material and the organic material 110b, so as to prevent the carrier board from warping phenomenon, thereby improving the structural reliability.

FIG. 4A to FIG. 4D are schematic cross-sectional views illustrating some steps of a manufacturing method of a circuit board according to another embodiment of the invention. The manufacturing method of the circuit board of the embodiment is similar to that of the circuit board 100b, and the difference between the two is the step of disposing the composite layer of the non-conductor inorganic material and the organic material 110c (referring to FIG. 4D) and conductive structures 120c (referring to FIG. 4D) on the first built-up structure 130b.

Figure 4A:
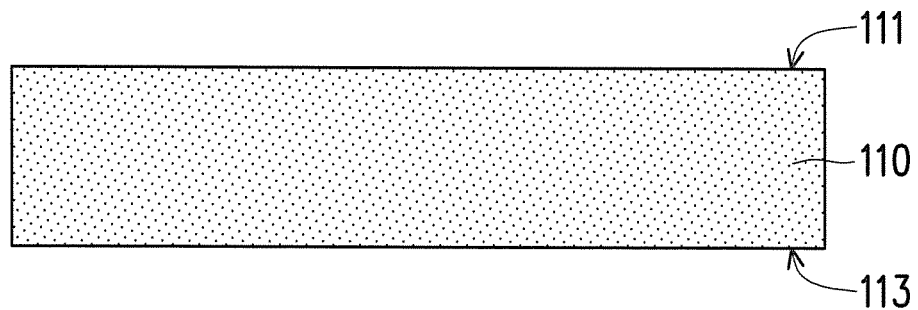
FIG. 4A to FIG. 4D are schematic cross-sectional views illustrating some steps of a manufacturing method of a circuit board according to another embodiment of the invention.
Figure 4B:
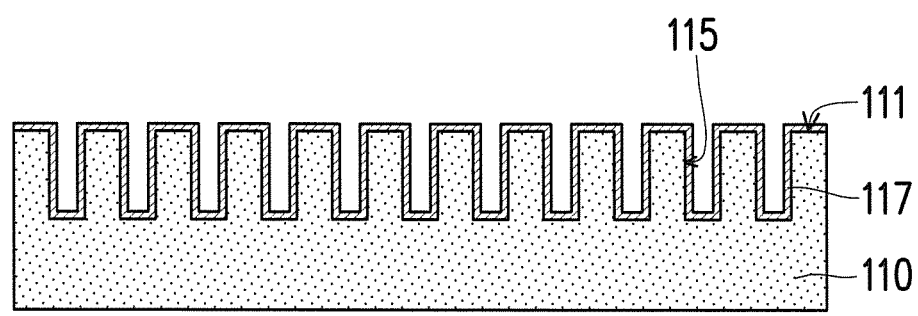

Specifically, first, referring to FIG. 4A, a composite material layer of a non-conductor inorganic material and an organic material 110 is provided, wherein the composite material layer of the non-conductor inorganic material and the organic material 110 has an upper surface 111 and a lower surface 113 opposite to each other. Then, referring to FIG. 4B, a plurality of blind holes 115 are formed at the upper surface 111 of the composite material layer of the non-conductor inorganic material and the organic material 110. Then, an electroplating seed layer 117 is formed on the upper surface 111 of the composite material layer of the non-conductor inorganic material and the organic material 110 and on hole walls of the blind holes 115.

Figure 4C:
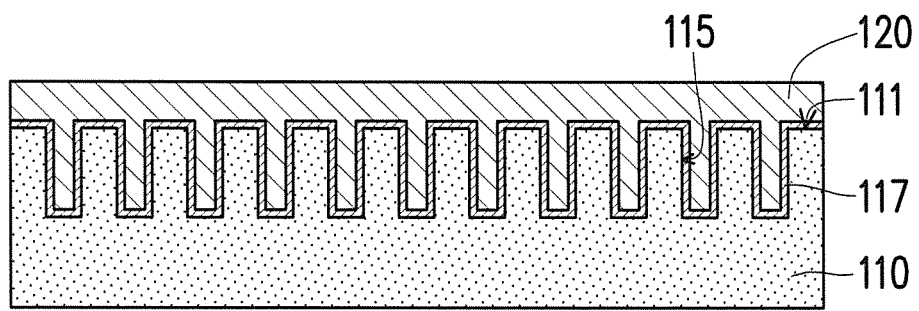
Figure 4D:
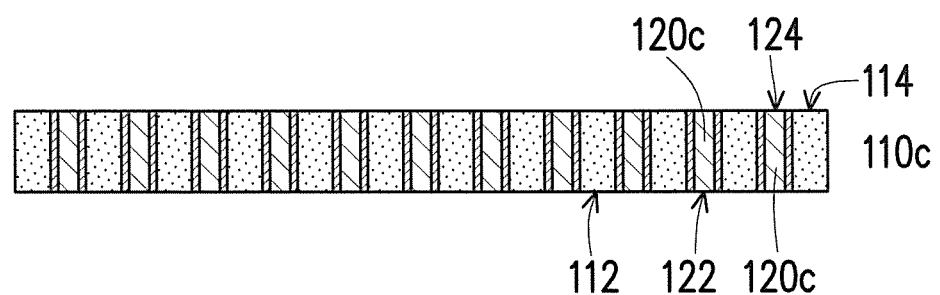

Then, referring to FIG. 4C, a conductive material layer 120 is formed on the upper surface 111 of the composite material layer of the non-conductor inorganic material and the organic material 110 and in the blind holes 115 through the electroplating seed layer 117, wherein the conductive material layer 120 fully fills the blind holes 115. Thereafter, referring to FIG. 4D, a portion of the conductive material layer 120 and a portion of the composite material layer of the non-conductor inorganic material and the organic material 110 are removed, so as to form the composite layer of the non-conductor inorganic material and the organic material 110c and conductive structure 120c. The conductive structures 120c may be a plurality of conductive pillars. The first surface 112 and the second surface 114 opposite to each other of the composite layer of the non-conductor inorganic material and the organic material 110c are respectively trimmed with the third surface 122 and the fourth surface 124 of each of the conductive pillars (i.e., conductive structures 120c). At last, the formed composite layer of the non-conductor inorganic material and the organic material 110c and the conductive structures 120c are disposed on the first built-up structure 130b of FIG. 3A, and then following the steps of FIG. 3D to FIG. 3F to complete the fabrication of the circuit board.

In summary, since the circuit board of the invention has two built-up structures respectively disposed on two opposite surfaces of the composite layer of the non-conductor inorganic material and the organic material, that is, the composite layer of the non-conductor inorganic material and the organic material can be regarded as a strengthened layer, which has a higher hardness compared with a normal dielectric layer and encapsulating material. Thus, the overall structural strength of the circuit board of the invention can be enhanced through the composite layer of the non-conductor inorganic material and the organic material, so as to prevent the carrier board from warping phenomenon, thereby improving the process yield.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A circuit board, comprising:
   a composite layer of a non-conductor inorganic material and an organic material, having a first surface and a second surface opposite to each other and a plurality of openings;
   a plurality of conductive structures, respectively disposed in the openings of the composite layer of the non-conductor inorganic material and the organic material;
   a first built-up structure, disposed on the first surface of the composite layer of the non-conductor inorganic material and the organic material and electrically connected to the conductive structures; and
   a second built-up structure, disposed on the second surface of the composite layer of the non-conductor inorganic material and the organic material and electrically connected to the conductive structures,
   wherein a number of layers of the first built-up structure is greater than a number of the layers of the second built-up structure, and a thickness of the first built-up structure is smaller than a thickness of the second built-up structure;
   wherein the first built-up structure comprises at least one first dielectric layer, and the at least one first dielectric layer directly contacts the first surface of the composite layer of the non-conductor inorganic material and the organic material,
   the second built-up structure comprises at least one second dielectric layer, and the at least one second dielectric layer directly contacts the second surface of the composite layer of the non-conductor inorganic material and the organic material, and
   the composite layer of the non-conductor inorganic material and the organic material has a higher hardness compared with the first dielectric layer and the second dielectric layer;
   the composite layer of the non-conductor inorganic material and the organic material has a laminated structure in a sheet-shape, a brick-shape, or a combination thereof arrangement.

2. The circuit board as recited in claim 1, wherein a material of the composite layer of the non-conductor inorganic material and the organic material comprises a composite material composed of a ceramic material and a polymer material.

3. The circuit board as recited in claim 2, wherein the ceramic material comprises zirconia, aluminum oxide, silicon nitride, silicon carbide, silicon oxide, or a combination thereof, and the polymer material comprises epoxy resins, polyimide, liquid crystal polymers, methacrylate resins, vinyl phenyl resins, allyl resins, polyacrylate resins, polyether resins, polyolefin resins, polyamide resins, polysiloxane resins, or a combination thereof.

4. The circuit board as recited in claim 1, wherein the composite layer of the non-conductor inorganic material and the organic material is an imitation nacreous layer.

5. The circuit board as recited in claim 1, wherein a Young's modulus of the composite layer of the non-conductor inorganic material and the organic material is between 20 GPa and 100 GPa.

6. The circuit board as recited in claim 1, wherein the openings are a plurality of through vias connected to the first surface and the second surface of the composite layer of the non-conductor inorganic material and the organic material, the conductive structures are a plurality of conductive pillars, and the first built-up structure is electrically connected to the second built-up structure through the conductive structures.

7. The circuit board as recited in claim 1, wherein the first built-up structure comprises the first dielectric layer, at least a first patterned conductive layer, and at least a first conductive hole structure penetrating the first dielectric layer, the first dielectric layer and the first patterned conductive layer are sequentially stacked on the first surface of the composite layer of the non-conductor inorganic material and the organic material, and the first patterned conductive layer is electrically connected to the conductive structures through the first conductive hole structure.

8. The circuit board as recited in claim 1, wherein the second built-up structure comprises the second dielectric layer, at least a second patterned conductive layer, and at least a second conductive hole structure penetrating the second dielectric layer, the second dielectric layer and the second patterned conductive layer are sequentially stacked on the second surface of the composite layer of the non-conductor inorganic material and the organic material, and the second patterned conductive layer is electrically connected to the conductive structures through the second conductive hole structure.

9. The circuit board as recited in claim 1, further comprising:
- a solder mask layer, disposed on the second built-up structure, wherein the solder mask layer exposes a portion of the second built-up structure; and
- a surface treatment layer, disposed on the second built-up structure exposed by the solder ask layer.

10. The circuit board as recited in claim 1, further comprising:
- a plurality of pads, disposed on the second surface of the composite layer of the non-conductor inorganic material and the organic material and electrically connected to the conductive structures, wherein the openings are a plurality of blind holes, a portion of the first built-up structure is embedded in the first surface of the composite layer of the non-conductor inorganic material and the organic material, and the pads are electrically connected to the first built-up structure through the conductive structures.

* * * * *